(12) United States Patent
Szu

(10) Patent No.: US 6,280,116 B1
(45) Date of Patent: Aug. 28, 2001

(54) FIXING DEVICE

(75) Inventor: Ming-Lun Szu, Taipei (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/393,597

(22) Filed: Sep. 10, 1999

(30) Foreign Application Priority Data

Dec. 18, 1998 (TW) .................................................. 87221134

(51) Int. Cl.[7] ...................................................... F16B 5/06
(52) U.S. Cl. ................. 403/408.1; 403/326; 248/222.11; 361/709
(58) Field of Search ..................................... 403/326, 329, 403/408.1, 328; 44/41, 48, 46; 361/697, 709, 801, 802, 704; 257/718; 248/222.11, 221.11

(56) References Cited

U.S. PATENT DOCUMENTS

| | | | |
|---|---|---|---|
| 2,941,439 | * 6/1960 | Rapata | 411/41 |
| 3,078,064 | * 2/1963 | Turnbull | 411/41 X |
| 3,148,578 | * 9/1964 | Gapp | 411/41 X |
| 3,765,295 | * 10/1973 | Ptak | 411/41 |
| 4,579,473 | * 4/1986 | Brugger | 411/41 X |
| 5,054,977 | * 10/1991 | Schultz | 411/48 X |
| 5,748,446 | * 5/1998 | Feightner et al. | 361/709 |
| 6,104,614 | * 8/2000 | Chou et al. | 361/709 X |

* cited by examiner

Primary Examiner—Harry C. Kim
(74) Attorney, Agent, or Firm—Wei Te Chung

(57) ABSTRACT

A fixing device comprises a first locking member, a second locking member and a pair of locking nuts. The first locking member includes a base portion, four engaging posts and a pair of positioning posts. A pair of platforms is formed on lateral ends of the base portion. Each platform forms a locking hole for receiving corresponding locking nut. Rotation of the locking nut is limited by the platform to ensure proper positioning of a cap of the locking nut. The engaging posts equidistantly extend from the base portion, and each engaging post forms a circular neck. Each positioning post downwardly extends from the corresponding platform, and has a hollow body communicating with the receiving hole. A slot is formed in each positioning post. The positioning post has an upper portion defining a hole having a diameter larger than that defined by a lower portion of the positioning post. A subulate portion is formed at a bottom end of each positioning post for engaging with the circuit board.

4 Claims, 5 Drawing Sheets

FIXING DEVICE

BACKGROUND OF THE INVENTION

The present invention relates to a fixing device, and particularly to a fixing device for attaching a heat sink to a CPU package, supporting the heat sink on a circuit board and preventing vibration of the heat sink during operation.

During operation of a computer, excessive heat is generated by electrical elements thereof. Since the processing speed of a CPU is increasing, more heat is generated. Thus, cooling the CPU package is an important consideration facing computer designers. Generally, a heat sink is employed to dissipate heat generated by the CPU package. The more heat generated, the larger the heat sink required. A fixing device is commonly used to attach the heat sink to the CPU package, support the heat sink on a circuit board and prevent vibration of the heat sink during operation.

A conventional fixing device comprises a first locking member, a second locking member and a pair of locking nuts. Generally, a pair of positioning posts is formed on a bottom surface of the second locking member, and the conventional positioning post is hollow. Each positioning post has a uniform inner diameter and engages a corresponding locking hole of a circuit board. The positioning post cannot provide adequate interference with the locking hole when engaging with a locking nut. Thus, vibration of the heat sink results during operation.

Thus, there is a need for an improved fixing device for reliably attaching a heat sink to a CPU package.

BRIEF SUMMARY OF THE INVENTION

A main object of the present invention is to provide a fixing device for engaging with a circuit board and securely attaching a heat sink to a CPU package.

Another object of the present invention is to provide a fixing device for preventing vibration of the heat sink during operation.

To fulfill the above-mentioned object, according to a preferred embodiment of the present invention, a fixing device comprises a first locking member, a second locking member and a pair of locking nuts. The first locking member includes a base portion, four engaging posts and a pair of positioning posts. A pair of platforms is formed on lateral ends of the base portion. Each platform forms a locking hole for receiving the corresponding locking nut. Rotation of the locking nut is limited by the platform to ensure proper positioning of a cap of the locking nut. The engaging posts are equidistantly disposed on the base portion, and each engaging post forms a circular neck. Each positioning post downwardly extends from the corresponding platform, and has a hollow body communicating with the receiving hole. A slot is formed in each positioning post. Each positioning post has an upper portion defining a hole having a diameter larger than that defined by a lower portion of the positioning post. A subulate portion is formed on a bottom of each positioning post for engaging with the circuit board.

Other objects, advantages and novel features of the invention will become more apparent from the following detailed description when taken in conjunction with the accompanying drawings.

DETAILED DESCRIPTION OF THE INVENTION

Figure 1:
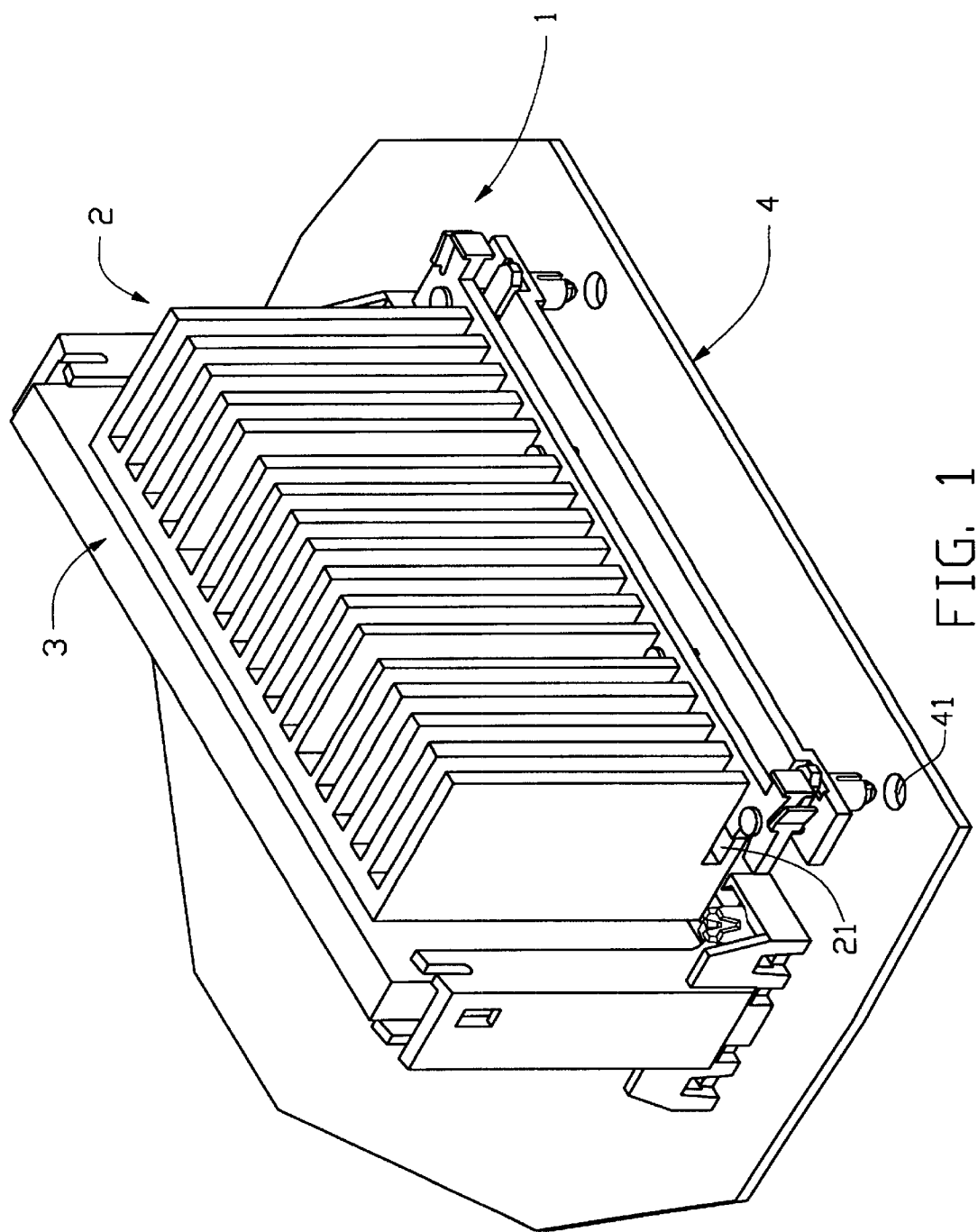
FIG. 1 is a perspective view of a fixing device in accordance with the present invention assembled with a heat sink, a CPU package and a circuit board.

Referring to FIG. 1, a heat sink 2 is attached to a CPU package 3, and the CPU package 3 is mounted on a circuit board 4. A fixing device 1 securely supports the heat sink 2 on the circuit board 4 for preventing vibration of the heat sink 2.

Figure 2:
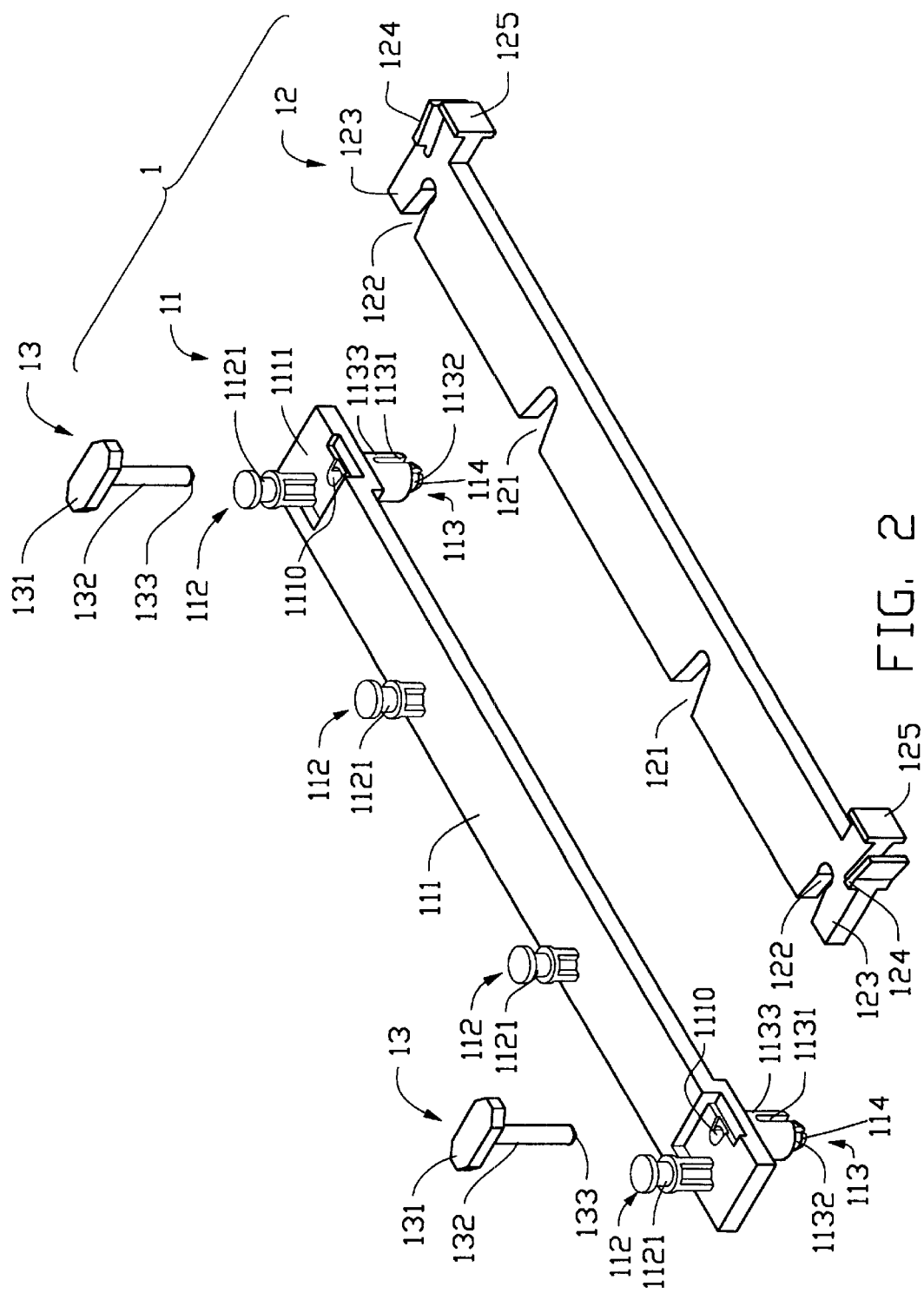
FIG. 2 is an exploded view of the fixing device in accordance with the present invention.

Referring to FIG. 2, the fixing device 1 comprises a first locking member 11, a second locking member 12 and a pair of locking nuts 13. The first locking member 11 includes a base portion 111, four engaging posts 112 and a pair of positioning posts 113. A pair of platforms 1111 is formed on lateral ends of the base portion 111. Each platform 1111 forms a locking hole 1110 for receiving the corresponding locking nut 13 therein. Rotation of the locking nut 13 is limited by the platform 1111 to ensure proper positioning of a cap 131 of the locking nut 13 thereby facilitating manual manipulation. The engaging posts 112 are equidistantly disposed on the base portion 111, and each engaging post 112 forms a circular neck 1121.

The positioning posts 113 are respectively formed on the two lateral ends of the base portion 111 under the corresponding platform 1111. Each positioning post 113 has a hollow body communicating with the receiving hole 1110. A slot 1131 is formed in each positioning post 113. Each positioning post 113 has an upper portion 1133 defining a hole having an diameter larger than that defined by a lower portion 1132 thereof (best seen in FIG. 5). A subulate portion 114 is formed at a bottom of the positioning post 113 with a shoulder section (not labeled) for engaging with the circuit board 1.

Figure 3:
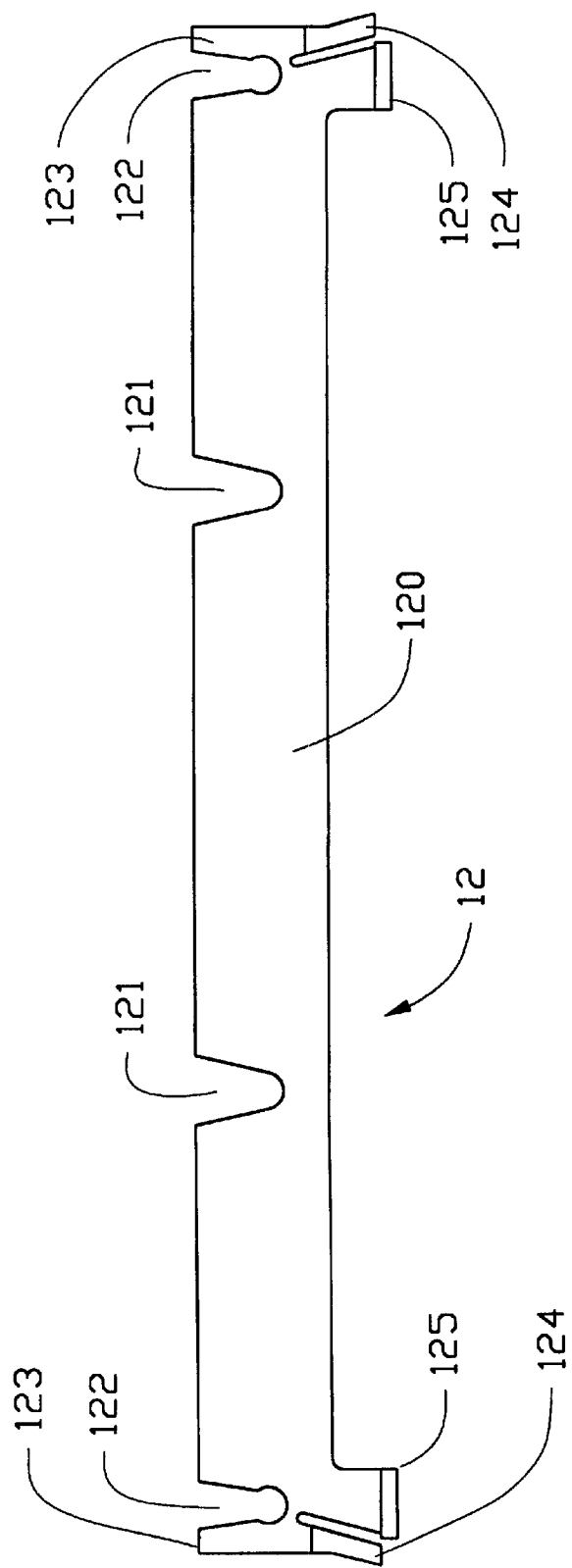
FIG. 3 is a top view of a second locking member of the fixing device.

Referring to FIG. 3, the second locking member 12 comprises a pair of central locking cutouts 121 formed in a middle portion thereof, a pair of lateral locking cutouts 122 formed at lateral ends thereof. A pair of locking arms 123 formed at lateral ends of the second locking member 12 neighboring the corresponding locking cutouts 122. A pair of handles 124 and a pair of push portions 125 are respectively formed opposite to the lateral locking cutouts 122 and the locking arms 123. The central locking cutouts 121 and the lateral locking cutouts 122 are formed in a body portion 120 of the second locking member 12 for engaging the corresponding circular necks 1121 of the first locking member 11. The push portions 125 are manually manipulated for pushing the second locking member 12 to lock with the first locking member 11.

Figure 4:
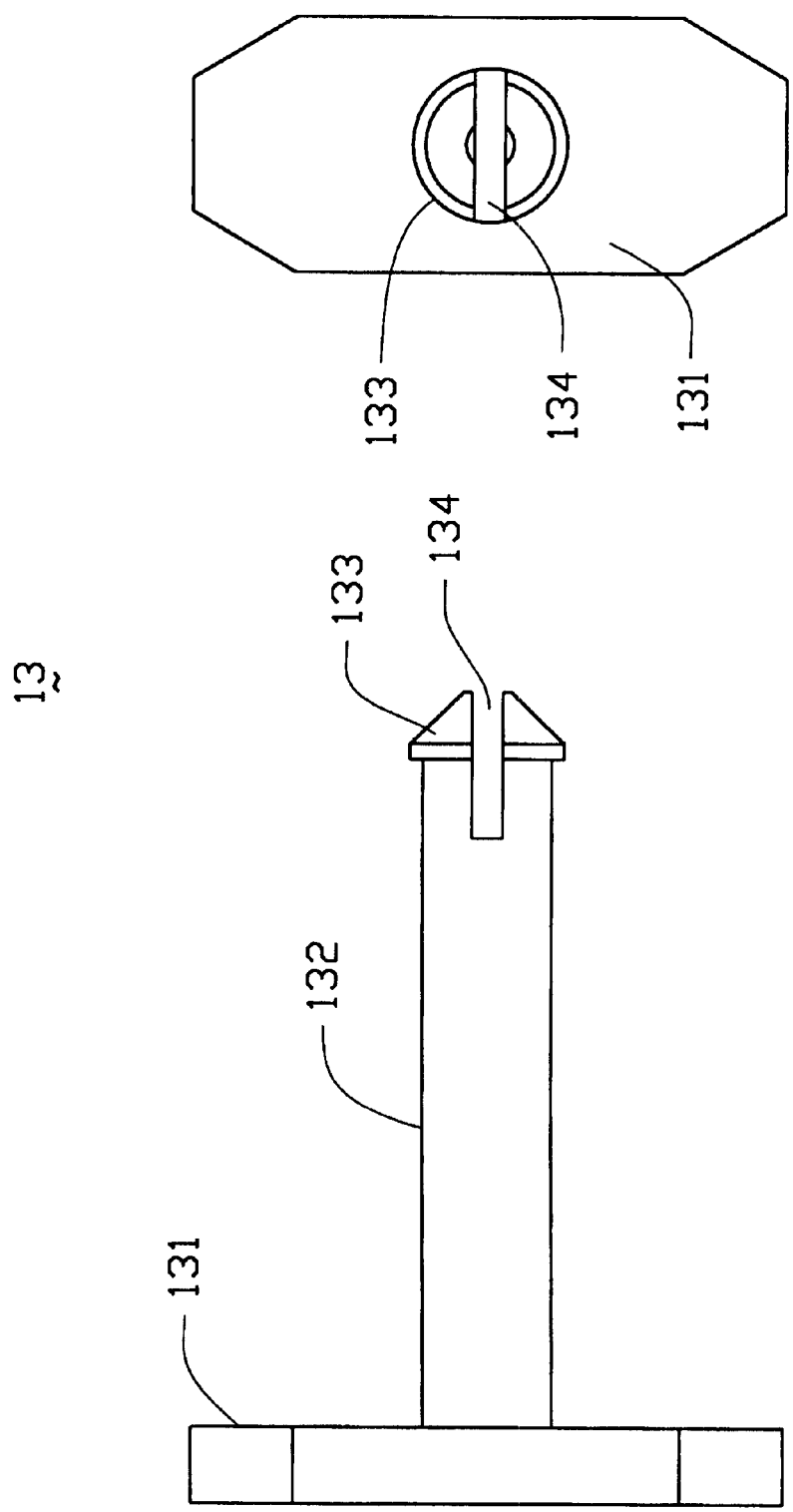
FIG. 4A is a side view of a locking nut of the fixing device.
FIG. 4B is a bottom view of the locking nut.

Also referring to FIGS. 4A and 4B, each locking nut 13 comprises a cylindrical body 132 extending from a cap 131, an expanding portion 133 formed at a free end thereof. A central slot 134 is formed in the expanding portion 133 for providing resilience in assembly. The diameter of the cylindrical body 132 is smaller than the diameter of the hole defined by the upper portion 1133 and larger than that defined by the lower portion 1132 of the positioning post 113. When assembling, the cylindrical body 132 of the locking nut 13 extends through and expands the lower portion 1132 and the subulate portion 114, causing the positioning post 113 to securely engage with the circuit board 4.

Figure 5:
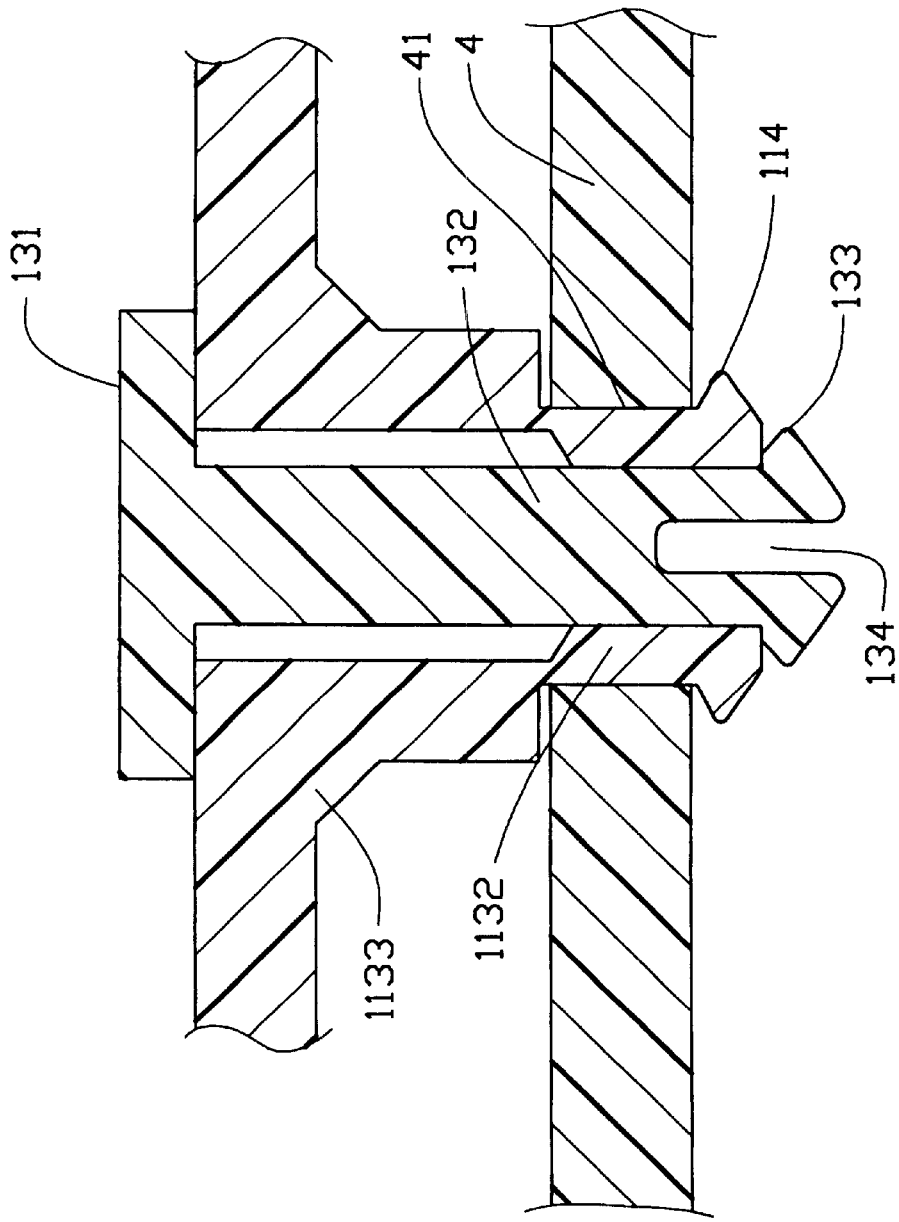
FIG. 5 is a cross-sectional view of the locking nut assembled with a first locking member of the fixing device and the circuit board.

Referring to FIGS. 1, 2 and 5, during assembly, the locking nut 13 is inserted into the upper portion 1133 of the positioning post 113, and the second locking member 12 is pushed whereby the cutouts 121, 122 lock with the corresponding circular necks 1121. The second locking member 12 is received in a receiving portion 21 of the heat sink 2. The expanding portion 133 of the locking nut 13 then extends through the positioning post 113 and the lower portion 1132 expands to engage with a corresponding locking hole 41 of the circuit board 4. Thus, the fixing device 1 securely supports the heat sink 2 on the circuit board 4.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A fixing device comprising:
    a first locking member comprising a base portion, a plurality of engaging posts extending from the body portion, a pair of platforms formed on lateral ends of the base portion and a pair of positioning posts downwardly extending from the platforms, each platform forming a locking hole, the engaging posts being equidistantly disposed on the base portion, each engaging post forming a circular neck thereon, each positioning post comprising upper and lower portions defining a hollow body communicating with the locking hole, an inner diameter of the upper portion of said positioning post being larger than an inner diameter of the lower portion of said positioning post, whereby a step face is formed between the upper and lower portions;
    a second locking member comprising a body portion, a pair of central locking cutouts formed in the body portion, a pair of lateral locking cutouts also formed in the body portion, a pair of locking arms formed at lateral ends of the body portion, a pair of handles and a pair of push portions formed at lateral sides of the body portion opposite to the locking arms and the lateral locking cutouts, the central locking cutouts and the lateral locking cutouts being for engaging the corresponding circular necks of the first locking member; and
    a pair of locking nuts received in the corresponding locking holes comprising a cylindrical body, a cap formed at a free end of the cylindrical body, an expanding portion formed opposite to the cap and a central slot formed in the expanding portion, the diameter of the cylindrical body being smaller than the inner diameter of the upper portion and larger than the inner diameter of the lower portion of the positioning post;
    wherein the expanding portion extends through the upper portion and then the step face to engage with and expand the lower portion of the corresponding positioning post.

2. The fixing device as claimed in claim 1 wherein a subulate portion downwardly extends from the positioning post for engaging with a circuit board.

3. The fixing device as claimed in claim 1, wherein each locking nut forms a central slot for facilitating insertion into the positioning post.

4. The fixing device as claimed in claim 1, wherein the body diameter of the locking nut is smaller than the inner diameter of the upper portion and larger than inner diameter of the lower portion of the positioning post for providing reliable engagement with the positioning post.

* * * * *